US007516271B2

(12) United States Patent  
Joshi

(10) Patent No.: US 7,516,271 B2  
(45) Date of Patent: Apr. 7, 2009

(54) OBTAINING SEARCH RESULTS BASED ON MATCH SIGNALS AND SEARCH WIDTH

(75) Inventor: Mayur Joshi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 325 days.

(21) Appl. No.: 11/593,131

(22) Filed: Nov. 6, 2006

(65) Prior Publication Data

US 2007/0113003 A1 May 17, 2007

Related U.S. Application Data

(63) Continuation of application No. 10/630,812, filed on Jul. 31, 2003, now Pat. No. 7,152,141.

(51) Int. Cl.  
*G06F 12/00* (2006.01)

(52) U.S. Cl. .................................... 711/108; 365/49.16

(58) Field of Classification Search ................. 711/108, 711/103; 365/49.17, 49.16, 203, 230.03  
See application file for complete search history.

(56) References Cited

U.S. PATENT DOCUMENTS

| 4,928,260 | A | 5/1990 | Chuang et al. |
|---|---|---|---|
| 5,440,715 | A | 8/1995 | Wyland |
| 6,175,513 | B1 | 1/2001 | Khanna |
| 6,331,942 | B1 | 12/2001 | Peterson |
| 6,462,694 | B1 | 10/2002 | Miyatake |
| 6,493,793 | B1 | 12/2002 | Pereira et al. |
| 6,553,453 | B1 | 4/2003 | Gibson et al. |
| 6,708,250 | B2 * | 3/2004 | Gillingham .................. 711/108 |
| 6,757,779 | B1 | 6/2004 | Nataraj et al. |
| 6,771,525 | B2 | 8/2004 | Roth |
| 6,829,153 | B1 * | 12/2004 | Park et al. ................. 365/49.17 |
| 6,879,532 | B1 * | 4/2005 | Proebsting et al. ........... 365/203 |

(Continued)

OTHER PUBLICATIONS

McAuley et al., "A Self-Testing Reconfiguration CAM", IEEE Journal of Solid-State Circuits, vol. 26, No. 3, Mar. 1991, pp. 257-261.*

(Continued)

*Primary Examiner*—Pierre-Michel Bataille  
(74) *Attorney, Agent, or Firm*—Dickstein Shapiro LLP

(57) ABSTRACT

Content addressable memory (CAM) in which search results such as an address code and an array match signal can be obtained for multiple search widths. The CAM includes a CAM array that can provide match signals and suppress signals for memory locations. Match combining circuitry combines the match signals for memory locations to obtain combined match signals; the combination depends on an indicated search width, which can be one of a set of multiples of the memory location width. A priority encoder provides a priority signal indicating a combined match signal that has priority and is asserted; the priority encoder can therefore be smaller than would be necessary to prioritize all the match signals. An address encoder obtains most significant bits of an address code in response to the priority signal. Select circuitry responds to the priority signal by selecting match signals and suppress signals for the combined match signal with priority. The selected match signals are used to obtain least significant bits (LSBs) of the address code in accordance with the search width. The LSBs, selected suppress signals, and a PE match signal from the priority encoder are used to obtain an array match signal.

13 Claims, 10 Drawing Sheets

U.S. PATENT DOCUMENTS

| | | | |
|---|---|---|---|
| 6,901,000 | B1 | 5/2005 | Ichiriu et al. |
| 6,944,709 | B2 | 9/2005 | Nataraj et al. |
| 6,972,978 | B1 * | 12/2005 | Miller et al. ............. 365/49.16 |
| 7,000,066 | B1 * | 2/2006 | Wanzakhade et al. ....... 711/108 |
| 2002/0161969 | A1 | 10/2002 | Nataraj et al. |
| 2003/0016575 | A1 | 1/2003 | Regev |
| 2003/0070039 | A1 | 4/2003 | Gillingham |
| 2003/0163637 | A1 | 8/2003 | Villaret et al. |
| 2003/0223259 | A1 | 12/2003 | Roth |
| 2004/0064444 | A1 | 4/2004 | Villaret et al. |

OTHER PUBLICATIONS

Lakshman et al., "High-Speed Policy-Based Packet Forwarding Using Efficient Multi-Dimensional Range Matching", SIGCOMM, 1988, pp. 203-214.*

Wang et al., "Realization of Bidirection Association Memory Using a Pseudo-Parallel Searching Approach," 1995 IEEE International Conference on Neural Networks, vol. 3, pp. 1502-1507, Dec. 1995.*

N. McKeown, "How Scalable is the Capacity of (Electronic) IP Routers?," Stanford University, pp. 1-36.

N. McKeown, "Memory for High Performance Internet Routers," Stanford University, pp. 1-31.

M. Kobayashi et al., "A Processor Based High-Speed Longest Prefix Match Search Engine," IEEE, 2001, pp. 233-239.

P. Gupta et al., "Routing Lookups in Hardware at Memory Access Speeds," Proc. Infocom, San Francisco, Apr. 1998, pp. 1-8.

"LN17020 Search Engine, Version 2.0," Lara Networks, Inc., pp. 1-129 downloaded Apr. 5, 2001 from URL http://www.st.com.

* cited by examiner

OBTAINING SEARCH RESULTS BASED ON MATCH SIGNALS AND SEARCH WIDTH

CROSS REFERENCE TO RELATED APPLICATIONS

This application is a continuation of U.S. patent application Ser. No. 10/630,812, filed Jul. 31, 2003 now U.S. Pat. No. 7,152,141 and is also related to U.S. patent application Ser. No. 10/630,757, filed Jul. 31, 2003 (now U.S. Pat. No. 6,831,587, issued Dec. 14, 2004), the disclosures of which are incorporated by reference in their entirety.

FIELD OF THE INVENTION

The invention relates to techniques for obtaining search results in a content addressable memory (CAM).

BACKGROUND OF THE INVENTION

A CAM is a memory device with specialized circuitry to access stored data based on its content; CAM can be contrasted, for example, with memory devices that access data using only an address or other data indicating its location. CAMs are useful in various applications requiring fast search over a database, list, or pattern. CAMs are particularly well suited for handling packet protocols, such as TCP/IP protocols employed in packet processors that route information across an intranet or the Internet.

Conventionally, a CAM includes a memory array, each location of which can store a data entry. Comparison circuitry in the memory array makes it possible to search memory locations based on content. In response to search data, conventional CAM comparison circuitry typically stores bit values in a comparand register and then compares comparand register bits with bits of entries stored in memory locations. The comparison circuitry can apply an appropriate match criterion requiring some or all bits to match.

Two or more locations in a CAM memory array may store data entries that satisfy a match criterion, especially where the criterion requires only a few bits to match. Therefore, conventional CAMs also include a priority encoder (PE) for resolving multiple matches. A typical CAM's PE receives a match signal for each location in the memory array and provides a priority signal with the same number of bits as there are memory locations. At most one bit of the priority signal can be asserted at a time. An asserted bit in the priority signal indicates that the respective location's match signal is asserted and has priority. An address encoder can then convert the priority signal to an address code, and the address code can be used in a manner suitable to the application, such as to retrieve information relevant to the search data.

Conventional CAM PEs also provide a match bit indicating whether a search resulted in any asserted match signals, and this match bit indicates no match when it is turned off. The PE match bit is typically used in obtaining an output match bit for a CAM.

Each CAM memory location typically includes a set of status bits or flags that are used in CAM operations. For example, some conventional CAMs provide a bit for each location that, when asserted, causes the CAM to ignore, override, or otherwise suppress an asserted match signal for that location. Some CAMs also use a bit of this type in obtaining search results.

In recent years, various integrated circuits (ICs) with CAM capabilities have become commercially available. These CAM ICs have a variety of features for obtaining search results.

Some conventional CAM ICs allow multiple search widths. For example, some commercially available CAM ICs can be configured to widths of 32 or 64 bits, others to 68, 136, or 272 bits, and others to 72, 144, or 288 bits. These ICs may, for example, include circuitry to combine match results for adjacent groups of two or four entries to obtain a match result for a double or quadruple width.

It would be advantageous to have additional techniques for obtaining CAM search results, particularly techniques that improve area- and power-efficiency of CAM ICs. It would be advantageous to have improved techniques both for obtaining output address codes and also for obtaining output match bits.

BRIEF SUMMARY OF THE INVENTION

The invention provides new techniques for obtaining search results in CAMs. Embodiments of the techniques provide CAM ICs with improved area- and power-efficiency.

Some embodiments make it possible to use a smaller priority encoder (PE) with a CAM memory array of a given size, and to provide for multiple search widths. Match signals from a CAM array are combined based on search width, and the resulting combined match signals are provided to the PE. The resulting PE priority signal is used to select appropriate match signals for the search width, and selected match signals can be used in obtaining an output address code indicating search results. The priority signal can also be used to select appropriate suppress signals, which can be used to obtain an array match signal, also indicating search results.

These and other features and advantages of the invention will be apparent from the following detailed description and drawings.

DETAILED DESCRIPTION OF THE INVENTION

The terms "content addressable memory" and "CAM" are used herein to describe any memory device with specialized circuitry to access stored data based on its content. While CAMs can take many forms, CAMs typically include a "CAM array", meaning a memory array that stores entries in locations and that also searches for locations with stored entries that satisfy a match criterion.

Many CAMs can be characterized as receiving "search data", meaning one or more items of data that indicate a match criterion for a search, and providing "match signals", meaning signals that indicate locations satisfying the match criterion. As used herein, the term "match signal" can refer to a signal indicating search results, however obtained, whether by comparing one memory location's data entry with a search index, by logically combining a number of such comparison results to obtain a combined match signal, or by any other appropriate comparison technique. As used herein, a match signal is "asserted" when it has a value indicating that one or more locations satisfy a matching criterion; although a bit is sometimes referred to as "on" to indicate that it is asserted, a match signal bit in a given circuit may be asserted when it has either of its values, whether high or low, on or off, "0" or "1", and not asserted when it has the other value.

In addition to a CAM array, a typical CAM includes circuitry for obtaining "search results", used herein to mean output signals provided by the CAM that indicate results obtained for a given search. Although search results could take various forms, search results conventionally include "address codes", meaning codes indicating locations, and "array match signals", meaning match signals for a CAM array as a whole; conventional examples of array match signals include match bit output indicating whether a search resulted in any match signals and multiple match bit output indicating whether a search resulted in more than one match signal.

Search results typically depend not only on match signals as defined above, but also on additional data such as status bits or flags for locations in a CAM array. The term "suppress signal" is used herein to mean a signal indicating that an asserted match signal should be suppressed, ignored, or otherwise prevented from affecting some or all search results. Suppress signals are often based on stored suppress values such as status bits or flags. A single bit suppress signal or a flag on which a single bit suppress signal is based is sometimes referred to as a force no hit (FNH) bit, a term that is used herein. Specifically, a location's FNH bit, when asserted, indicates that a match signal from the location should be ignored; if a location's match signal and FNH bit are both asserted and the location has priority, none of the output lines should be asserted, thus indicating that there is no best match.

Figure 1:
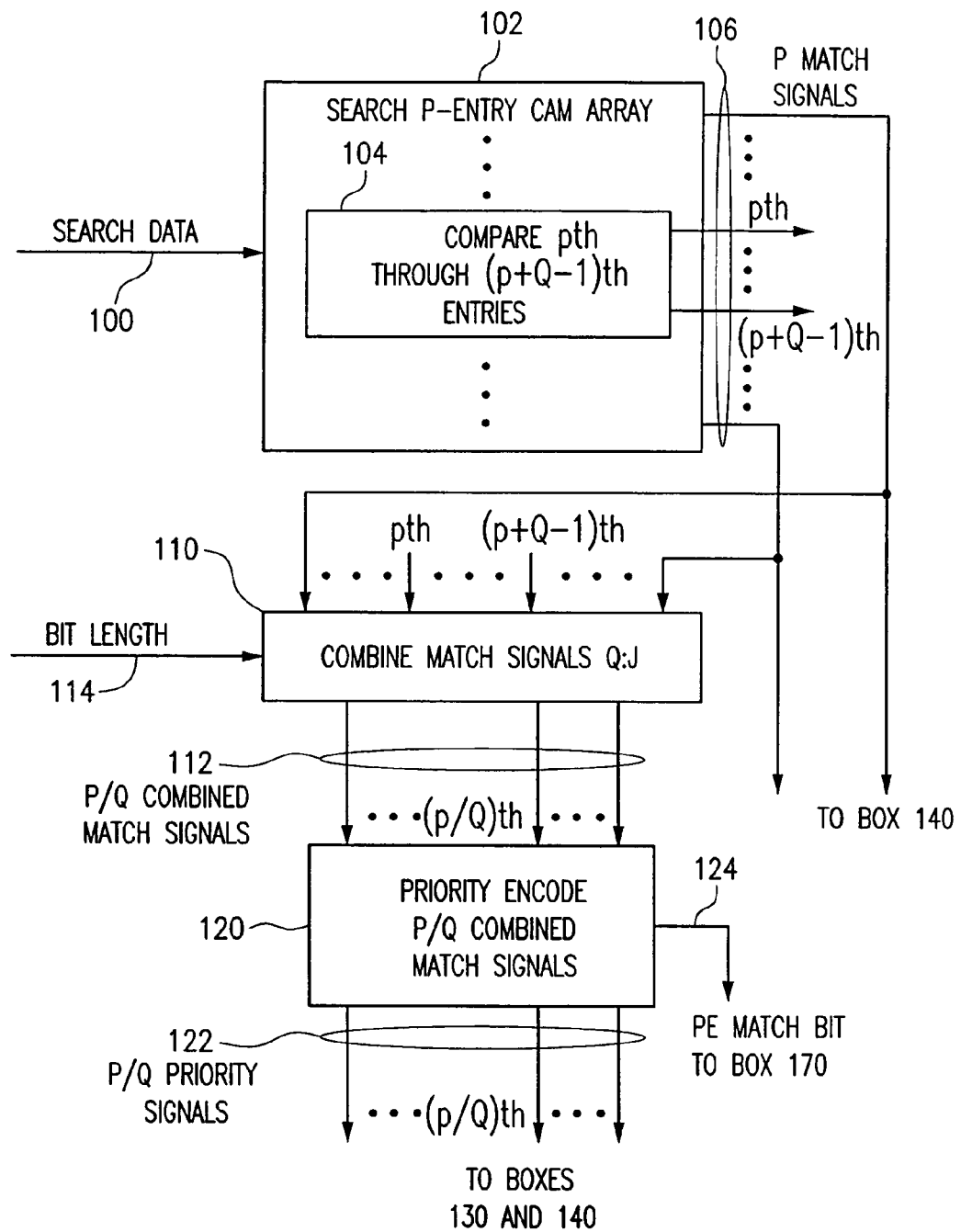
FIGS. 1 and 2 are schematic flow diagrams together illustrating an exemplary method embodiment in which priority signals are obtained for combined match signals and then used, together with match signals, to obtain search results in a content addressable memory (CAM).
Figure 2:
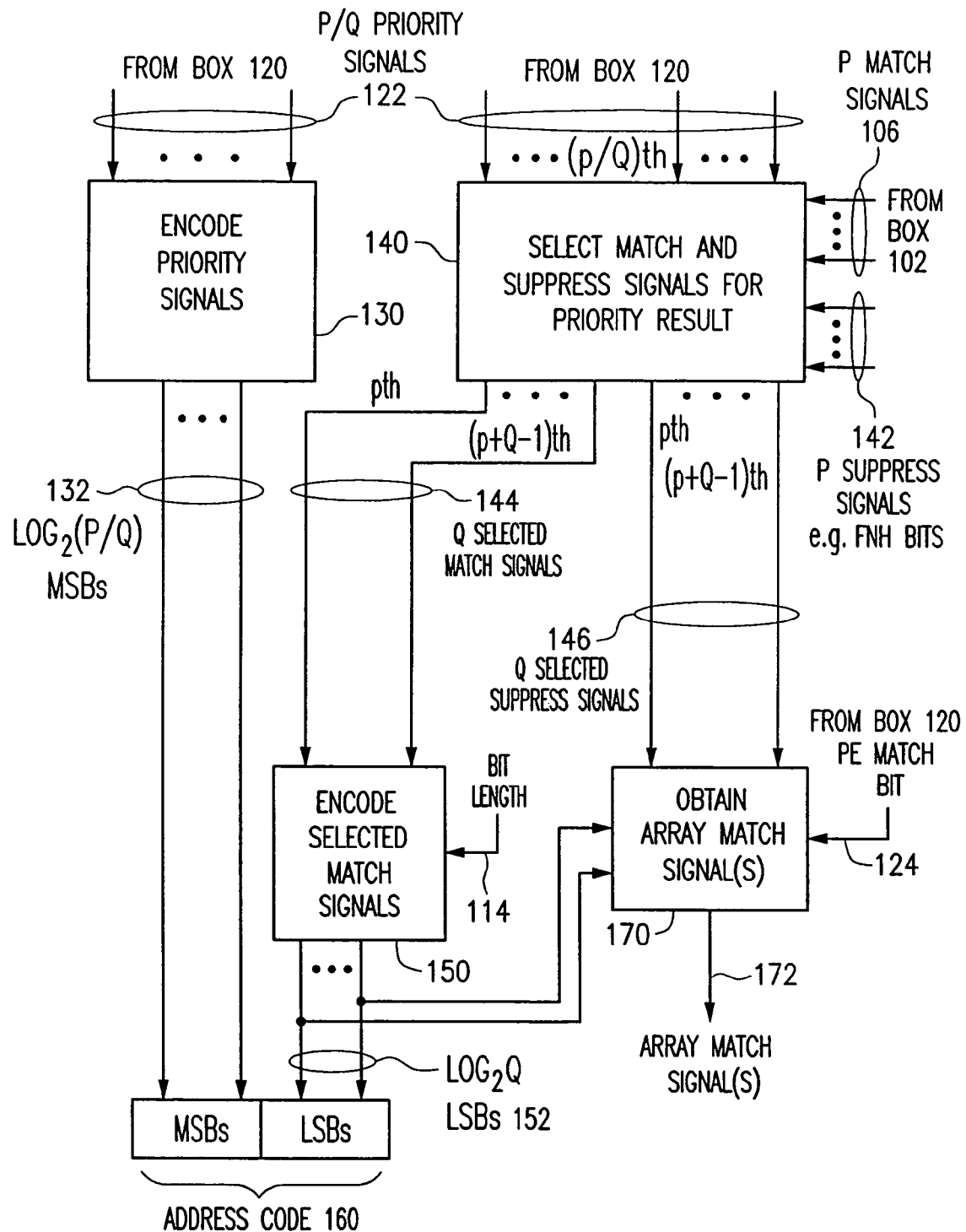

FIGS. 1 and 2 show general features of an exemplary method embodiment, with each box in FIGS. 1 and 2 representing an operation or set of operations included in the method. FIG. 1 illustrates how priority signals can be obtained for combined match signals in a CAM. FIG. 2 illustrates how priority signals like those from FIG. 1 can be used to select match signals and suppress signals such as force no hit (FNH) bits, which are then used to obtain search results.

The operations in FIG. 1 begin with search data 100, which can indicate a matching criterion in any way that is appropriate for the CAM's memory array. The operation in box 102 searches the CAM array, applying the match criterion indicated by search data 100.

In the illustrated embodiment, the CAM array has P entries, where P is a multiple of Q, the maximum number of match signals to be combined. The suboperation in box 104 compares each of a group of Q entries to determine whether they satisfy the matching criterion; in general, each entry in the group will be compared to determine whether it satisfies a respective part of the match criterion. The Q entries in the group are illustratively designated as pth through (p+Q−1)th entries, and a similar suboperation may be performed for each group of Q entries that begins with p=kQ from k=0 through (P/Q−1).

Results of the operation in box 102 include P match signals 106, each of which indicates whether the entry stored in a respective CAM array location satisfies its respective part of the matching criterion. As shown, match signals 106 include Q match signals resulting from the suboperation in box 104, designated the pth through (p+Q−1)th match signals.

The operation in box 110 logically combines groups of Q match signals 106, obtaining P/Q combined match signals 112 that depend on a search width indicated by bit length 114. Combined match signals 112 include a (p/Q)th combined match signal from the pth through (p+Q−1)th match signals from suboperation 104. For example, if each CAM array location stores an 80-bit entry and if Q=4, available search widths could include 80-bits, 160-bits, and 320-bits; a group of match signals $M_0$ through $M_3$ could be logically combined to obtain a combined match signal CM that depends on search width as follows: For an 80-bit search width, CM=$M_0$ OR $M_1$ OR $M_2$ OR $M_3$, asserted if any of $M_0$ through $M_3$ is asserted; for 160-bit search width, CM=($M_0$ AND $M_1$) OR ($M_2$ AND $M_3$), asserted if both of the upper pair of 80-bit entries or both of the lower pair of 80-bit entries are asserted; and for 320-bit search width, CM=$M_0$ AND $M_1$ AND $M_2$ AND $M_3$, asserted if all four 80-bit entries are asserted.

The operation in box 120 performs priority encoding on combined match signals 112, obtaining P/Q priority signals 122 indicating at most one combined match signal that has priority and is asserted. For example, the operation in box 120 could provide a (P/Q)-bit signal with at most one asserted bit indicating one combined match signal, illustratively the (p/Q)th. Or, as mentioned below in relation to two-level priority encoding, the operation in box 120 could produce upper and lower priority signals, each with at most one asserted bit, in which case the asserted bits would nonetheless indicate at most one combined match signal. The operation in box 120 also provides PE match bit 124, indicating whether any of combined match signals 112 is asserted.

The embodiment in FIG. 2 begins with priority signals 122 and PE match bit 124 like those from box 120 as well as match signals 106 like those from box 102.

The operation in box 130 encodes priority signals 122, obtaining $\log_2(P/Q)$ most significant bits (MSBs) 132 that serve as a block address code for the group of Q entries whose combined matching signal has priority and is asserted. If priority signals 122 indicate that the (p/Q)th combined matching signal has priority and is asserted, for example, MSBs 132 will be an address code for the pth through (p+Q−1)th CAM array entries.

The operation in box 140 is also performed using priority signals 122, in this case to select from P match signals 106 and from P suppress signals 142, which could be the CAM array's FNH bits for the P stored entries. The operation in box 140 selects the match signals and suppress signals for the Q entries whose priority signal is asserted. If the (p/Q)th bit of priority signals 122 is asserted, for example, selected match signals 144 will be Q match signals for the pth through (p+Q−1)th CAM array entries and selected suppress signals 146 will similarly be Q suppress signals for the same CAM array entries.

The operation in box 150 encodes selected match signals 144, obtaining $\log_2 Q$ least significant bits (LSBs) 152 that specify a location in the CAM array at which the priority matching entry or entries begin. As shown in FIG. 2 and described in more detail below, this operation can be performed in response to bit length 114, to obtain LSBs appropriate for the search width.

MSBs 132 and LSBs 152 together form address code 160, a search result that can then be provided by the CAM as output to other circuitry.

The operation in box 170 uses selected suppress signals 146, obtaining at least one array match signal 172 and possibly more. As shown in FIG. 2 and described in more detail below, this operation can also be performed in response to bit length 114 and also in response to PE match bit 124, to obtain array match signal(s) appropriate for the search width and the PE match bit.

The exemplary embodiments in FIGS. 1 and 2 illustrate numerous features that can be implemented in various combinations for improved CAM search.

For example, after receiving search data indicating a match criterion, the operation in box 102 obtains match signals, each indicating whether a respective location in the CAM has a stored entry satisfying a match criterion; a related operation can also obtain a suppress signal for each location, based on the location's stored suppress value, such as a force no hit (FNH) bit. The operation in box 110 provides combined match signals in response to the match signals and to a search width signal; each combined match signal is a combination of a respective group of match signals or memory locations, and the combination depends on the indicated search width. The operation in box 120 obtains priority signals. The priority signals indicate, for each combined match signal, whether it has priority and is asserted. In other words, the priority signals indicate at most one combined match signal whose group of memory locations includes an entry with the indicated search width and that has priority and satisfies the match criterion. The operation in box 120 also provides a PE match signal or bit indicating whether any of the combined match signals is asserted.

Further, the operation in box 140 responds to the priority signals, selecting the respective group of match signals and a group of suppress signals for respective locations whose combined match signal has priority and is asserted. The operation in box 130 responds to the priority signals, providing most significant bits (MSBs) of an address code for memory locations of the selected group of match signals. The operation in box 150 responds to the selected group of match signals and to the search width signal, providing least significant bits (LSBs) of the address code, which is for a memory location that stores at least part of an entry of the indicated search width that satisfies the match criterion. Finally, the operation in box 170 responds to the LSBs of the address code, the selected group of suppress signals, and the PE match signal; it provides an array match signal that is asserted only when the PE match signal is asserted and no suppress signal is asserted for the entry indicated by the address code.

Figure 3:
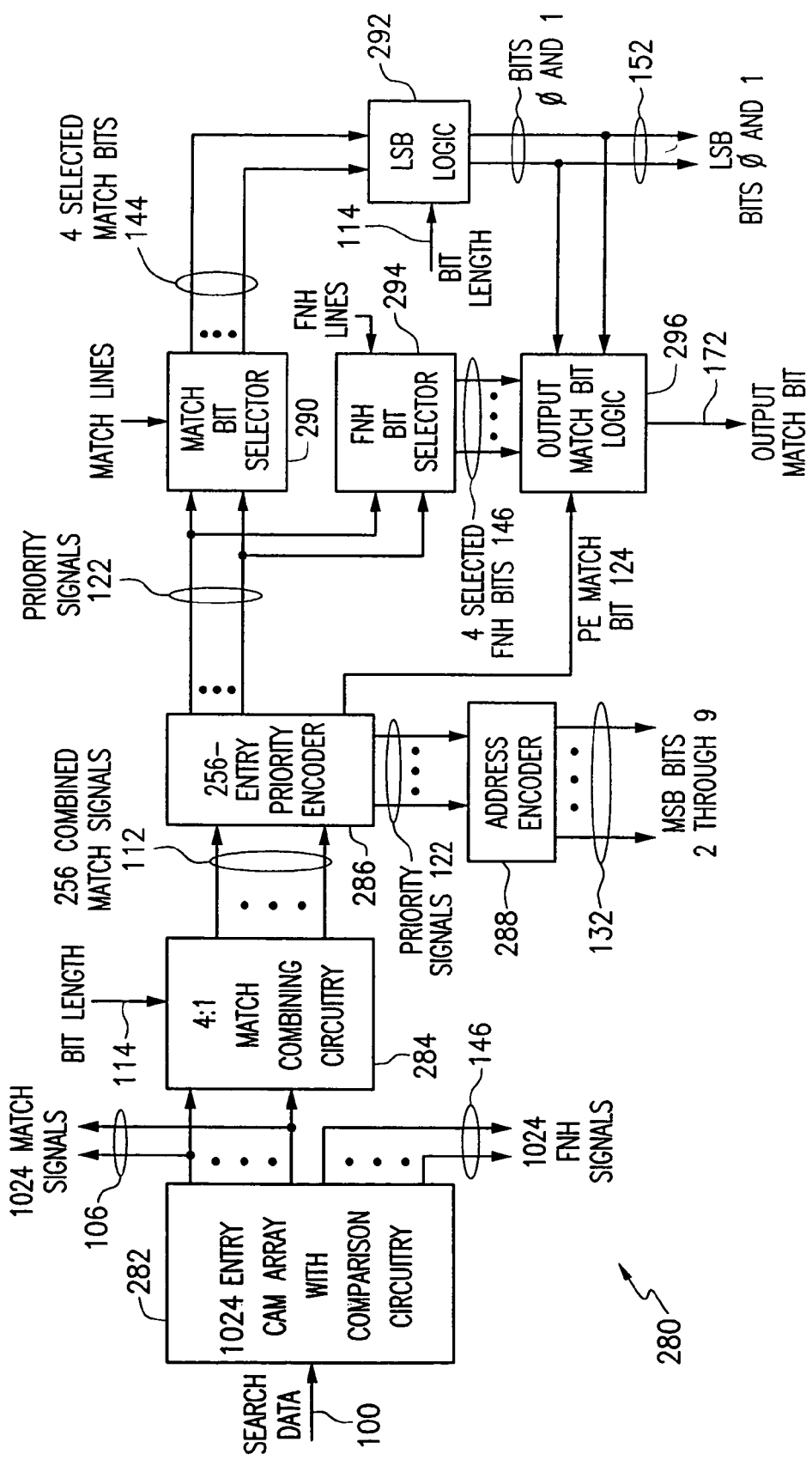
FIG. 3 is a schematic circuit diagram of a CAM circuit in which the method embodiment of FIGS. 1 and 2 is implemented.

The embodiment in FIGS. 1 and 2 could be implemented in a wide variety of circuits. FIG. 3 shows CAM circuitry 280, an exemplary circuit embodiment that includes features in FIGS. 1 and 2. Signals in FIG. 3 that are counterparts of signals in FIGS. 1 and 2 are labeled with the same reference numerals. In the illustrated embodiment, the value P in FIGS. 1 and 2 has been implemented as 1024 and the value Q as 4, so that P/Q is 256.

CAM circuitry 280 includes 1024-entry CAM array 282, 4:1 match combining circuitry 284, 256-entry priority encoder 286, address encoding circuitry 288, match bit selector 290, least significant bit (LSB) logic 292, force no hit (FNH) bit selector 294, and match bit logic 296. CAM array 282 stores 1024 multiple-bit (e.g. 80-bit, 160-bit, or 320-bit) entries in respective locations and includes comparison circuitry that responds to search data 100 and a stored entry, indicating whether the stored entry satisfies a matching criterion indicated by search data 100. In response to search data 100, CAM array 282 provides, for each location, a match signal indicating whether its stored entry satisfies the matching criterion, thus implementing the operation in box 102 in FIG. 1. Other components of CAM circuitry 280 respond to match signals 106.

Match combining circuitry 284 responds to match signals 106 from CAM array 282 and to bit length signal 114 indicating, e.g., 80, 160, or 320 bits as the search width if each entry in CAM array 282 is 80 bits. In response, circuitry 284 provides combined match signals 112 on 256 lines to priority encoder 286, thus implementing the operation in box 110 in FIG. 1.

Figure 4:
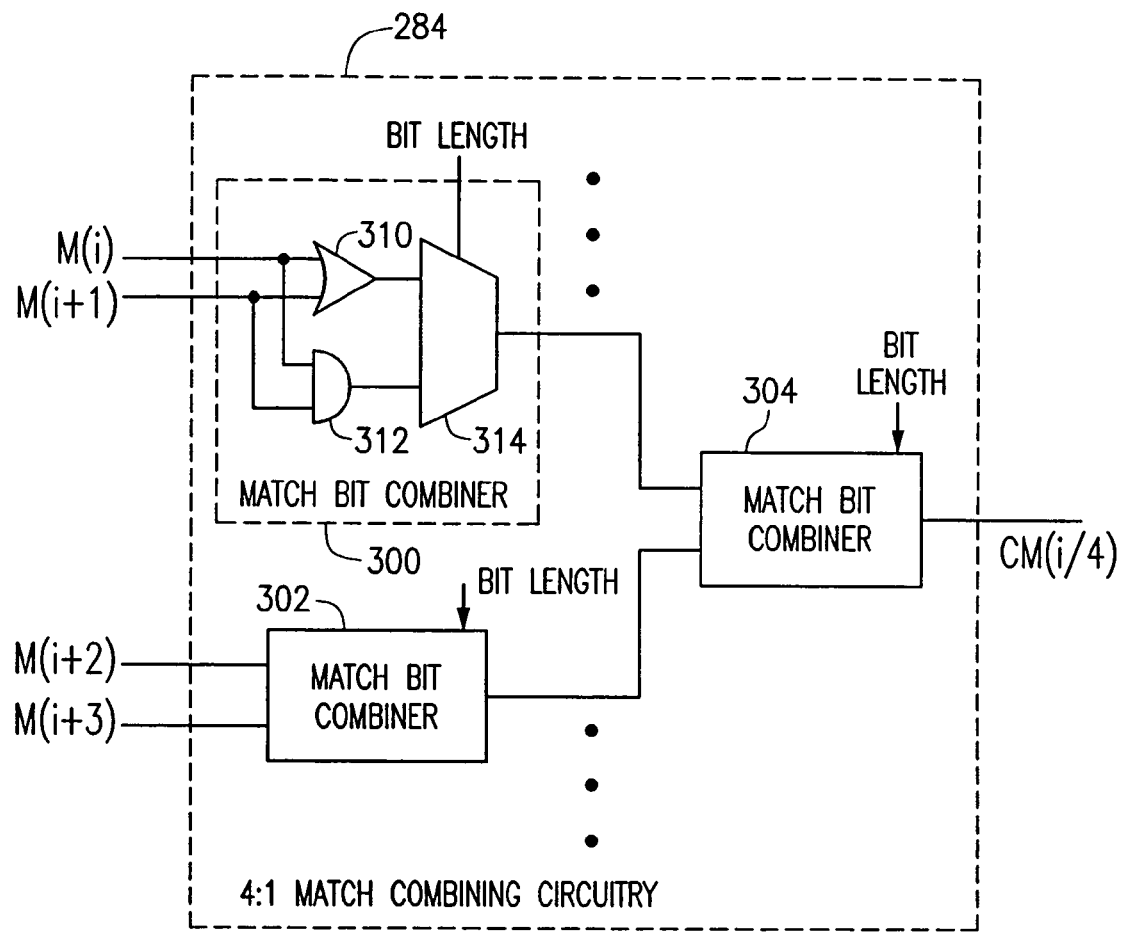
FIG. 4 is a schematic circuit diagram showing details of an exemplary embodiment implementing match combining circuitry 284 in FIG. 3.

FIG. 4 illustrates an exemplary embodiment of circuitry 284. For four consecutive lines, illustratively M(i) through M(i+3) where i is a non-negative multiple of 4, match bit combiner 300 combines match signals M(i) and M(i+1), match bit combiner 302 combines match signals M(i+2) and M(i+3), and match bit combiner 304 combines the intermediate results from combiners 300 and 302 to provide combined match signal CM(i/4).

Each of combiners 300, 302, and 304 can be implemented with standard CMOS static AND and OR gates as shown in greater detail in combiner 300, or with equivalent static NOR and NAND gates with appropriate inversions. The inputs to each combiner are received in parallel by OR gate 310 and AND gate 312, and one of the results from gates 310 and 312 is selected for output as CM(i/4) by multiplexer 314 based on the bit length signal. If the bit length signal indicates 80 bits, the output from OR gate 310 is selected in all three combiners; if 160 bits, the output from AND gate 312 is selected in combiners 300 and 302 and the output from OR gate 310 is selected in combiner 304; if 320 bits, the output from AND gate 312 is selected in all three combiners.

Match combining circuitry 284 performs 4:1 combining, but could easily be modified to perform 8:1 combining, such as to support a search width of 640 bits, or to perform combining at any other appropriate ratio.

Priority encoder (PE) 286 responds to CM(0) through CM(255) from match combining circuitry 284, providing respective priority signals 122, and thus implementing the operation in box 120 in FIG. 1. PE 286 could be conventional, with at most one of priority signals 122 asserted at a time. As with match signals, a priority signal is "asserted" when it has a value indicating that the respective match signal or other input has priority and is asserted; although a bit is sometimes referred to as "on" to indicate that it is asserted, a priority signal bit in a given circuit may be asserted when it has either of its values, whether high or low, on or off, "0" or "1", and not asserted when it has the other value.

Alternatively, priority encoder 286 can be a two-level priority encoder, with sixteen lower level PE circuits that each prioritizes sixteen of combined match signals 112, and one upper level PE circuit that prioritizes PE match bits from the lower level. If so, priority signals 122 can include sixteen best match signals for each set of 16 combined match signals, for a total of 256 best match signals at most one of which is asserted, and, from the upper level PE circuit, sixteen priority signals at most one of which is asserted.

Address encoding circuitry 288 responds to priority signals from priority encoder 286, providing the eight most significant bits (MSBs) of an output address code. The eight MSBs from circuitry 288 indicate a set of four locations in CAM array 282 for which at least one match signal indicates that a stored entry satisfies the matching criterion.

Circuitry 288 can be implemented with conventional components. Priority signals 122 can include one upper 16-bit priority signal and one lower 256-bit priority signal, each with at most one asserted bit as described above. The lower 256-bit priority signal can in turn include sixteen 16-bit lower level priority signals, each group of 16 bits being best match signals from one of the lower level priority encoder circuits. In this case, circuitry 288 can include one upper address encoder to convert the upper 16-bit priority signal to address code bits 6 to 9 and sixteen lower address encoders, each to convert one of the 16-bit lower level priority signals to four bits. The four bits from the sixteen lower address encoders can all be ORed with four 16-input dynamic OR gates to obtain address code bits 2 to 5.

Match bit selector 290 also responds to priority signals 122 from priority encoder 286, selecting and providing match signals 144 for the set of four locations in CAM array 282 indicated by priority signals 122, thus implementing part of the operation in box 140 in FIG. 2. LSB logic 292 responds to selected match signals 144 and bit length 114, providing the two LSBs 152 of the output address code. LSB logic 292 thus implements the operation in box 150 in FIG. 2.

Figure 5:
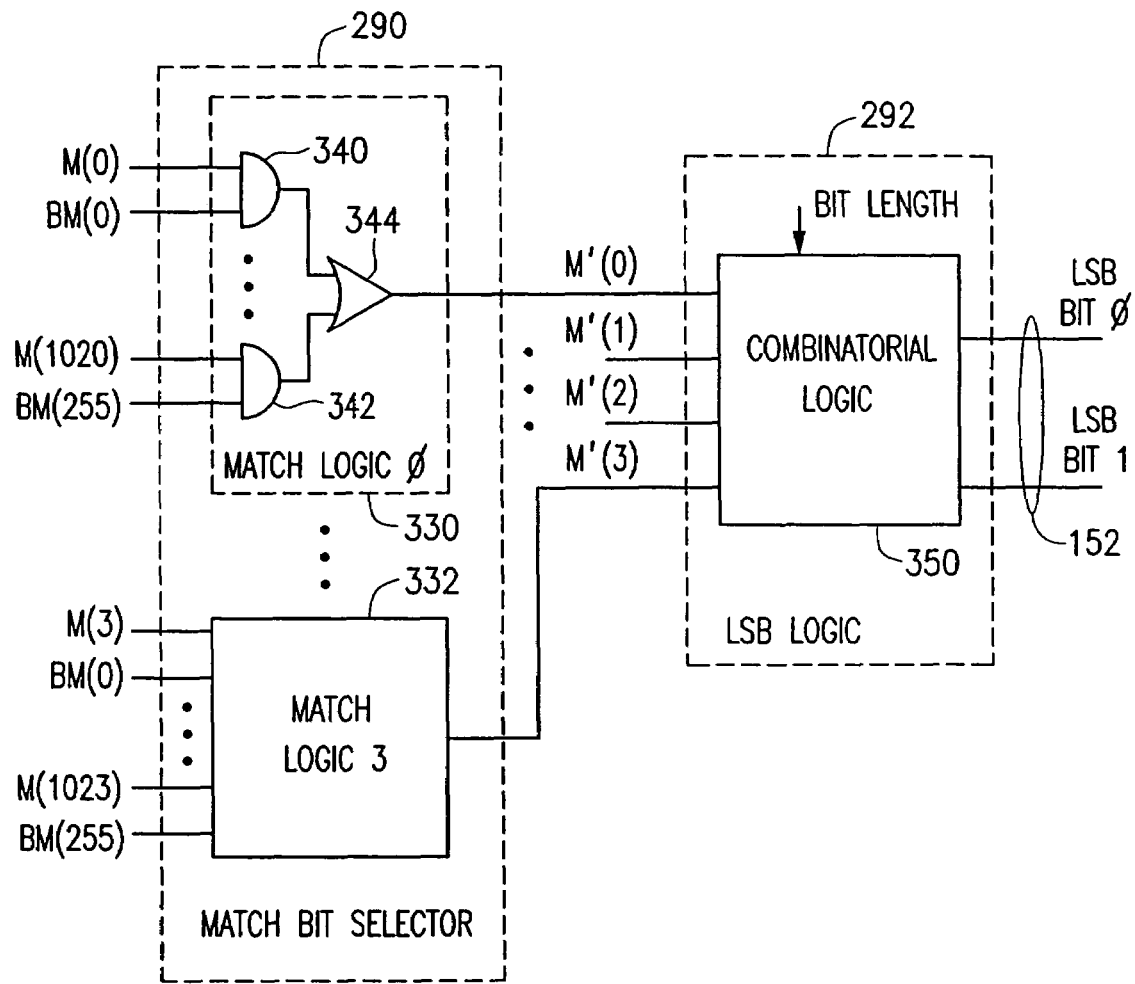
FIG. 5 is a schematic circuit diagram showing details of an exemplary embodiment implementing match bit selector 290 and least significant bit (LSB) logic 292 in FIG. 3.

FIG. 5 illustrates an exemplary embodiment implementing match bit selector 290 and LSB logic 292.

Match bit selector 290 can include four logic components, 0-bit match logic 330 through 3-bit match logic 332. Each match logic component can be implemented as shown in detail in match logic 330, illustratively shown with area-inefficient static gates but which can be implemented with dynamic logic as described below in relation to FIG. 7 for area efficiency. Match logic 330 includes 256 AND gates 340 through 342, and, for q=0 to 3 and k=0 to 255, the kth AND gate in the qth match logic responds to a respective one of match signals 106, labeled M(4 k+q), and a respective one of priority signals 122, labeled BM(k), where priority signals 122 include one signal for each of combined match signals 112; in a two-level implementation, priority signals 122 could be obtained from all the lower level PE circuits rather than only from the one with priority, but with all the BM(k) values low except those of the lower level PE circuit with priority.

The results from AND gates 340 through 342 are provided to OR gate 344, which provides the respective selected match signals M'(0), M'(1), M'(2), and M'(3) to LSB logic 292. Since at most one BM(k) is asserted at a time, at most one match signal will be selected by each match logic component and provided to LSB logic 292.

Components of match logic 330 could be implemented in various ways. For example, OR gate 344 could be implemented with a two level OR gate, in which a first stage combines 16 entries. This would speed up the readout process considerably but would impose some area penalty over a single OR gate. A sense-amp based design could also be implemented.

LSB logic 292 can include conventional combinatorial logic 350 to provide LSB bits 0 and 1, the LSBs of the address code. Combinatorial logic 350 can, for example, always provide "00" if the bit length is 320, regardless of the values of M'(0) through M'(3). If the bit length is 160, LSB circuitry 292 can provide "00" or "10", depending on which of the 160 bit entries matches on both its 80 bit parts or, if both match, LSB circuitry 292 can treat one 160 bit entry as having priority depending on a desired ordering of priority. If the bit length is 80, LSB circuitry 292 can provide "00", "01", "10", or "11", depending on which of the 80 bit entries matches or, if more than one match, LSB circuitry 292 can treat one of the matching 80 bit entries as having priority depending on a desired ordering of priority.

Force no hit (FNH) bit selector 294 also responds to priority signals 122 from priority encoder 286, selecting and providing FNH signals 146 for the set of four locations in CAM array 282 indicated by priority signals 122. FNH bit selector 294 thus implements another part of the operation in box 140 in FIG. 2.

Output match bit logic 296 provides an output match bit in response to several other signals, including LSB bits 0 and 1 from LSB logic 292, the selected FNH signals from FNH bit selector 294, and an overall match bit from priority encoder 286. Output match bit logic 296 thus implements part of the operation in box 170 in FIG. 2.

Figure 6:
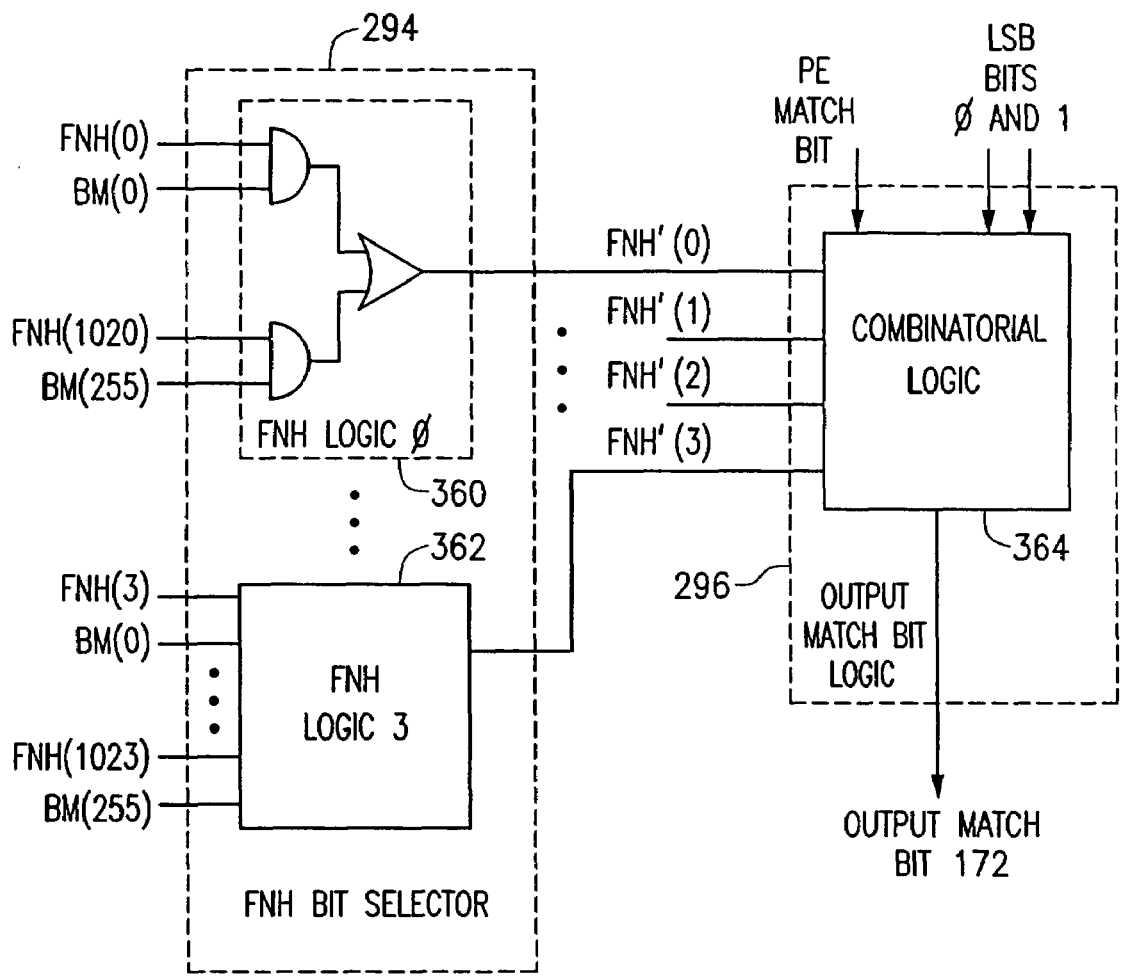
FIG. 6 is a schematic circuit diagram showing details of an exemplary embodiment implementing force no hit (FNH) bit selector 294 and output match bit logic 296 in FIG. 3.

FIG. 6 illustrates an exemplary embodiment implementing FNH bit selector 294 and output match bit logic 296.

Like match bit selector 290, FNH bit selector 294 can include four logic components, 0-bit FNH logic 360 through 3-bit FNH logic 362. As shown by FNH logic 360, each FNH logic component can be implemented as shown in detail in match logic 330 in FIG. 5, described above. At its output, FNH bit selector 294 provides the respective selected FNH signals FNH'(0), FNH'(1), FNH'(2), and FNH'(3) to output match bit logic 296.

Output match bit logic 296 can include conventional combinatorial logic 364 to provide the output match bit 172. Combinatorial logic 364 can, for example, provide an off or not asserted output whenever PE match bit 124 from priority encoder 286 is off. If PE match bit 124 is on, combinatorial logic 364 can provide an on or asserted output match bit 172 only when the FNH bit for the entry indicated by LSB bits 0 and 1 is not asserted.

In the implementation of combinatorial logic 364 described above, each location's FNH bit, when asserted, indicates that a match signal from the location should be ignored; if a location's match signal and FNH bit are both asserted and the location has priority, none of the output lines should be asserted, thus indicating that there is no best match. Combinatorial logic 364 could be implemented for other interpretations of an FNH bit or for other types of suppress signals with different effects.

Figure 7:
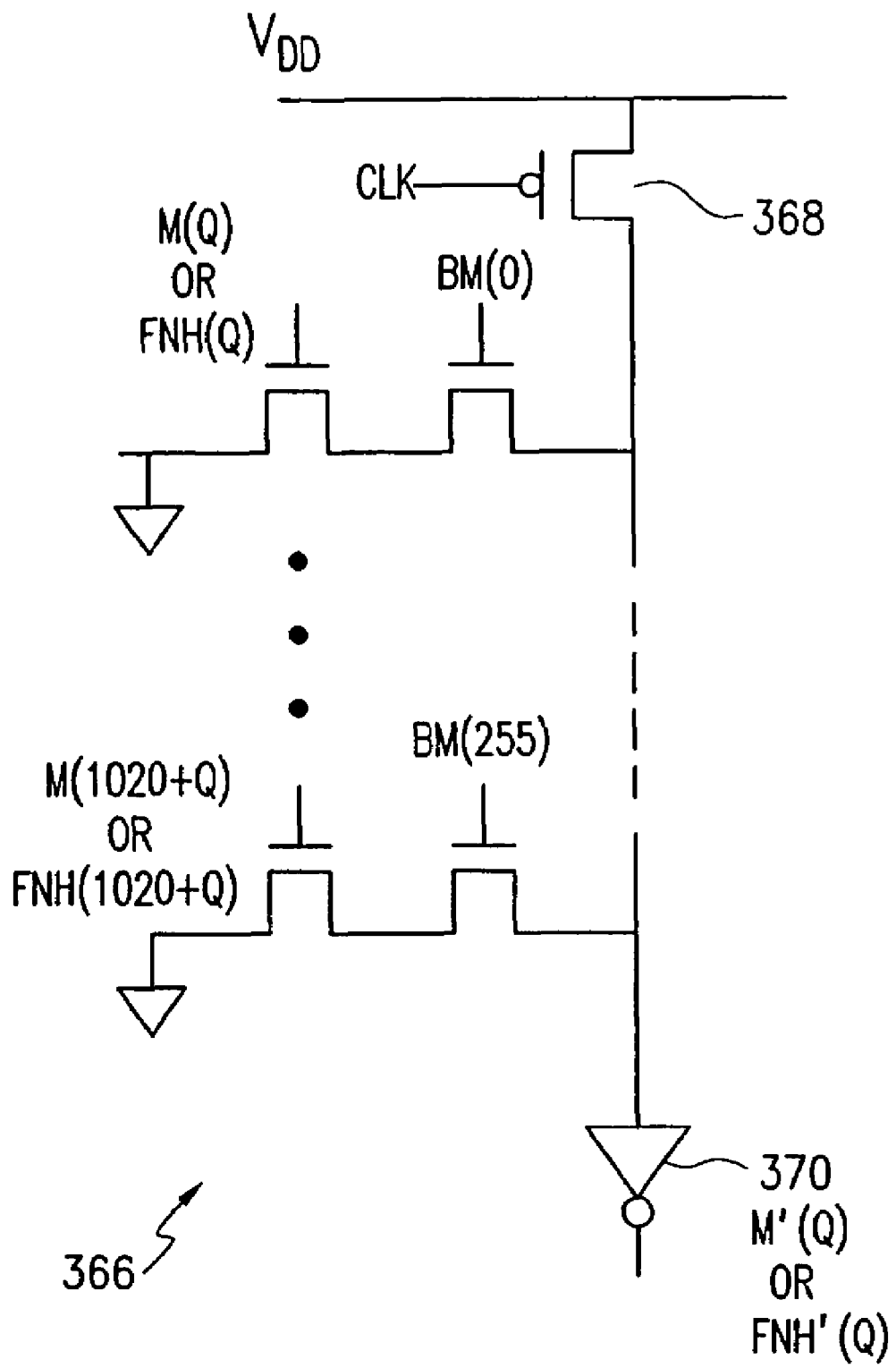
FIG. 7 is a schematic circuit diagram showing an exemplary embodiment implementing dynamic logic that can be used in the circuits of FIGS. 5 and 6.

FIG. 7 shows dynamic logic 366, an exemplary embodiment implementing the match logic components in match bit selector 290 or the FNH logic components in FNH bit selector 294. Dynamic logic 366 includes precharge transistor 368, which is controlled by a global clock signal clk. When transistor 368 is turned on, the input voltage to inverter 370 is precharged to $V_{DD}$, after which any of 256 pairs of transistors connected in series can pull down the input voltage to inverter 370, providing a high output signal M'(Q) or FNH'(Q), where Q has one of the values 0, 1, 2, or 3. In each pair of transistors in series, of which the first and last pair are illustratively shown, the gate of one transistor is connected to receive one of priority signals BM(0) through BM(255), and the gate of the other is connected to receive either one of every fourth of match signals M(Q) through M(1020+Q) or one of every fourth of FNH signals FNH(Q) through FNH (1020+Q).

Figure 8:
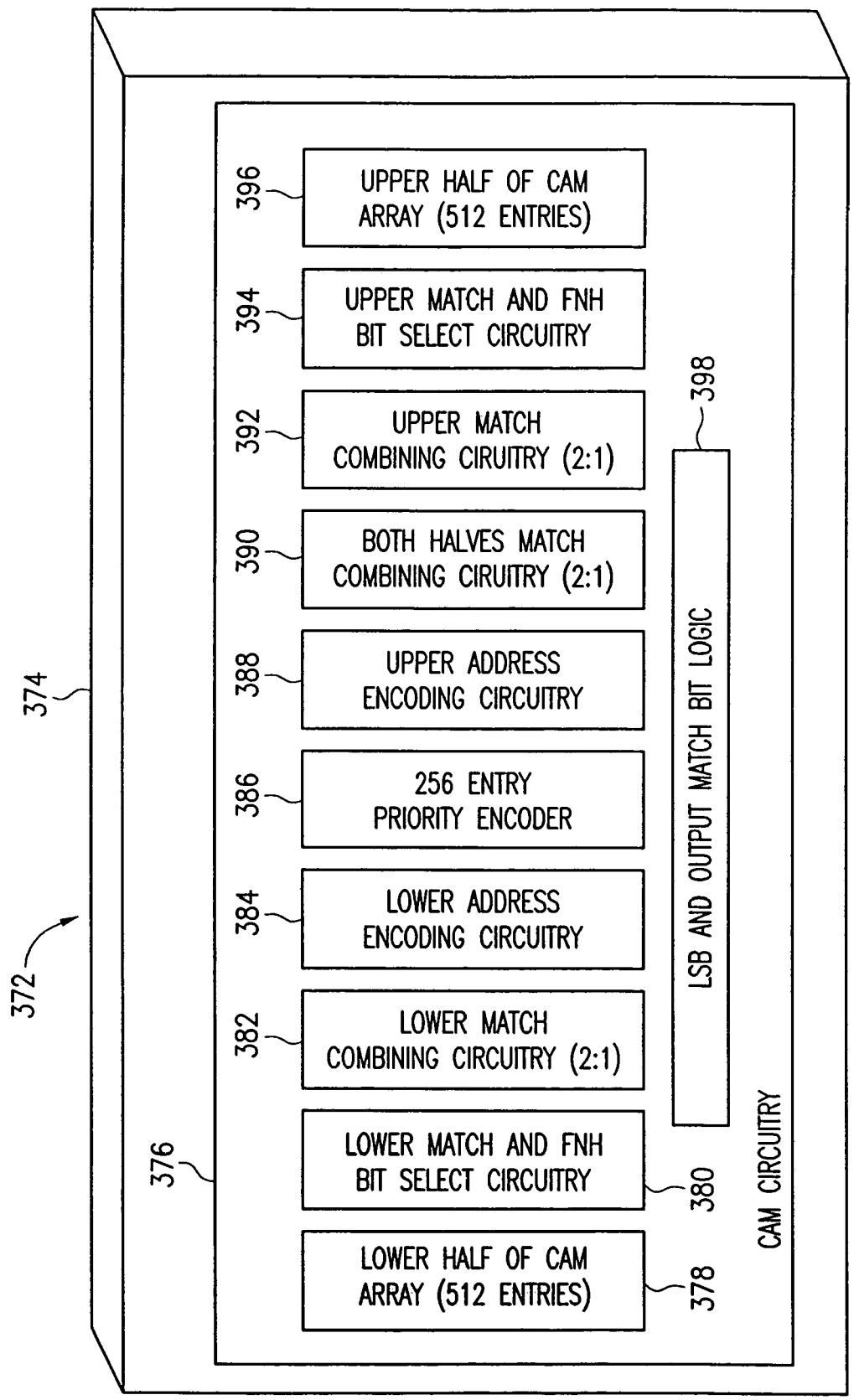
FIG. 8 is a schematic plan view of an integrated circuit with a CAM block layout that includes components as in FIG. 3.

In FIG. 8, integrated circuit (IC) 372 includes substrate 374 and one or more examples of CAM circuitry 376 (and optionally other circuitry not shown) formed at a surface of substrate 374, to obtain an area- and power-efficient CAM IC or to obtain a CPU or other application specific integrated circuit (ASIC) with CAM circuitry.

If IC 372 is a CAM IC, it can include several examples of CAM circuitry 376, referred to as CAM cores, along with circuitry to coordinate operations between them. Within the CAM cores, each CAM array would have read and write circuitry (not shown) associated with it. It would be possible, for example, to have 32 CAM cores. Each CAM core could have 4 priority encoders whose outputs are combined to find an entry in the CAM core that meets the matching criterion and has priority; a single output signal for that entry could then be provided to the coordinating circuitry for the CAM cores. Each CAM core could maintain an independent search table with an independent search width, and a search could be performed for entries matching a given search key in any or all of the CAM cores; alternatively, searches for entries matching different search keys could be performed concurrently in different cores.

In the illustrated exemplary embodiment, a CAM array is divided into two parts, which are separated from each other on the surface of substrate 374, with other circuitry components between them. CAM circuitry 376 includes lower CAM array 378, lower match and FNH bit select circuitry 380, lower match combining circuitry 382, lower address encoding circuitry 384, priority encoder 386, upper address encoding circuitry 388, both halves match combining circuitry 390, upper match combining circuitry 392, upper match and FNH bit select circuitry 394, upper CAM array 396, and LSB and output match bit logic 398. For k=0 to 255, lower CAM array 378 includes entries 4k and (4k+1), while upper CAM array 396 includes entries (4k+2) and (4k+3). The components of CAM circuitry 376 are illustratively shown as layout blocks without connections, but it will be understood that the blocks vary in size and shape and that appropriate connections are provided. The layout features shown could be provided with various combinations of layered structures.

Input and output signal connections and signal connections between blocks in CAM circuitry 376 can be understood from FIG. 3 and the above description. In addition, the arrangement of components within CAM circuitry 376 conserves metal lines by reducing the number of lines that extend between components. For example, 512 match lines and 512 FNH lines from lower CAM array 378 extend together to lower match and FNH bit select circuitry 380, and the 512 match lines alone extend further to lower half match combining circuitry 382, but need not extend further. Similarly, 512 match lines and 512 FNH lines from upper CAM array 396 need extend together only to upper match and FNH bit select circuitry 394, and the 512 match lines alone to upper half match combining circuitry 392. 256 output lines from lower half match combining circuitry 382 and 256 output lines from upper half match combining circuitry 392 must extend to both halves match combining circuitry 390. 256 combined match lines from circuitry 390 extend to priority encoder 386. With two-level priority encoding, 256 lower level priority signal lines extend from priority encoder 386 in both directions, to lower address encoding circuitry 384 and to lower match and FNH bit select circuitry 380 on one side and to upper match and FNH bit select circuitry 394 on the other. 16 upper level priority signal lines extend from priority encoder 386 to upper address encoding circuitry 388, a 16-bit priority encoder that is shown as a separate block for illustrative purposes; in the implementation of FIG. 7, however, the 16 Blk_sel signals go from upper level PE circuit 274 to priority tree 200 in each lower level PE 272, so that upper address encoding circuitry 388 can be fit between those components, within the perimeter of priority encoder 386. A small number of lines extend from other components to LSB and output match bit logic 398, and appropriate lines are also provided for output of the MSBs of the address code.

In operation, lower match combining circuitry 382 responds to match signals from lower CAM array 378 while upper match combining circuitry 392 responds to match signals from upper CAM array 396. The resulting combined match signals are provided to both halves match combining circuitry 390, which performs a further 2:1 combination.

Combined match signals from circuitry 390 are provided to priority encoder 386, which can be implemented with upper and lower level PE circuits that provide a set of 16 upper priority signals and a set of 256 lower priority signals, respectively, each set having at most one asserted bit as described above. These priority signals can be provided respectively to lower and upper address encoding circuitry 384 and 388 to obtain MSBs of address codes, as described above in relation to FIG. 8. In addition, the 256 lower priority signals from the lower level priority encoding circuits are provided to both lower and upper match and FNH bit select circuitry 380 and 394. Circuitry 380 responds to match and FNH signals from lower CAM array 378 and the priority signals, selecting match and FNH signals from lower CAM array 378 for the combined match signal indicated by the priority signals. Similarly, circuitry 394 responds to match and FNH signals from upper CAM array 396 and the priority signals, selecting match and FNH signals from upper CAM array 396 for the combined match signal indicated by the priority signals. Circuitry 380 and 394 provide the selected signals to LSB and output match bit logic 398.

LSB and output match bit logic 398 includes LSB logic as in FIG. 5 and output match bit logic as in FIG. 6. The LSB logic responds to the selected match signals from selecting circuitry 380 and 394, providing one or more least significant bits of the address code. Similarly, the output match bit logic responds to the selected FNH signals as well as the least significant bits, as described above in relation to FIG. 6.

CAM circuitry 376 could be formed with patterned layers on surface 374 using conventional photolithographic techniques. The patterned layers could include any suitable materials, deposited and patterned in any appropriate way.

The circuits in FIGS. 2-8 are divided into components in a way that facilitates description, but described components could be divided, combined, or implemented in other ways within the scope of the invention. For example, a search results circuitry component could receive priority signals from priority encoder 286 and provide search results at an indicated search width; or a search results circuitry component could receive selected match signals from match bit selector 290 and selected suppress signals from FNH bit selector 294 and provide search results; or a search results circuitry component could receive combined match signals from match combining circuitry 284 and provide an address code for a location storing at least part of an entry of an indicated search width. Similarly, either or both of CAM array 282 or priority encoder 286 could include circuitry to combine match signals. A selection circuitry component could include both match bit selector 290 and FNH bit selector 294, as suggested by circuitry 380 and 394 in FIG. 8. An address code circuitry component could receive match signals from CAM array 282 and provide an address code for an indicated search width.

Figure 9:
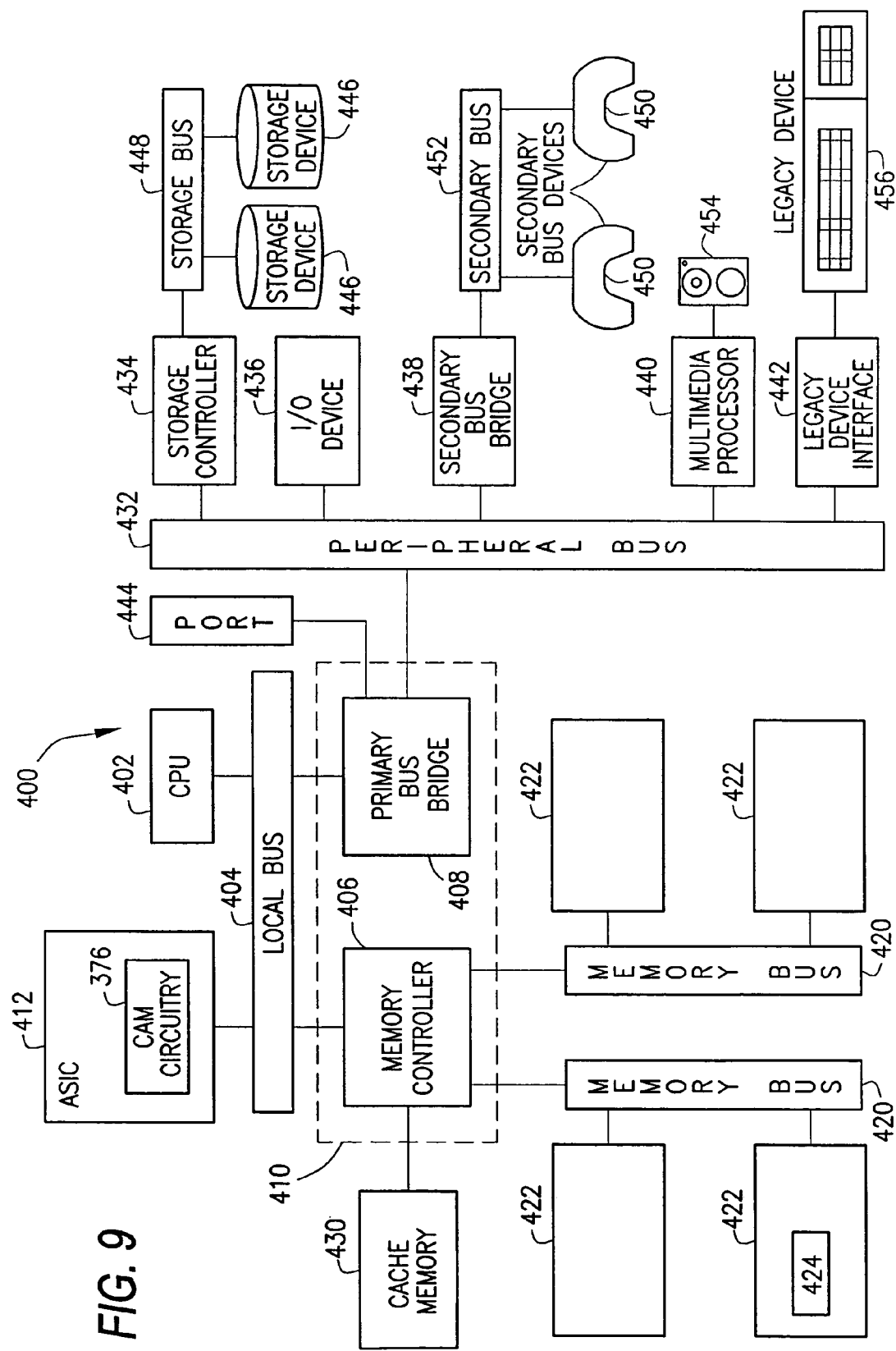
FIG. 9 is a schematic circuit diagram of a system that includes an integrated circuit as in FIG. 8.

FIG. 9 illustrates an exemplary processing system 400 that includes CAM circuitry 376 as shown in FIG. 8 on an application specific integrated circuit (ASIC). Processing system 400 includes one or more processors (CPUs) 402 connected to local bus 404. Memory controller 406 and primary bus bridge 408 are also connected to local bus 404. Processing system 400 may include multiple memory controllers 406 and/or multiple primary bus bridges 408. Memory controller 406 and primary bus bridge 408 may be integrated as a single device 410. ASIC 412 is also illustratively connected to local bus 404, and includes CAM circuitry 376 as in FIG. 8, embedded with other circuitry suitable to the application. ASIC 412 could, for example, be an additional CPU.

Memory controller 406 is also connected to one or more memory buses 420. Each memory bus accepts memory components 422, each of which may be a memory card or a memory module, for example. Some memory components 422 may include one or more additional devices 424. For example, in a SIMM or DIMM, additional device 424 might be a configuration memory, such as a serial presence detect (SPD) memory.

Memory controller 406 may also be connected to cache memory 430, which may be the only cache memory in processing system 400. Alternatively, other devices, such as processors 402, may also include cache memories, which may form a cache hierarchy with cache memory 430. If processing system 400 includes peripherals or controllers that are bus masters or that support direct memory access (DMA), memory controller 406 may implement a cache coherency protocol. If memory controller 406 is connected to two or more memory buses 420, each of memory buses 420 may be operated in parallel, or different address ranges may be mapped to different memory buses 420.

Primary bus bridge 408 is connected to at least one peripheral bus 432. Various devices, such as peripherals or additional bus bridges, may be connected to peripheral bus 432. These devices may include storage controller 434, miscellaneous I/O device 436, secondary bus bridge 438, multimedia processor 440, and legacy device interface 442. Primary bus bridge 408 may also be connected to one or more special purpose high speed port 444. In a personal computer, for example, special purpose high speed port 444 might be an Accelerated Graphics Port (AGP), used to connect a high performance video card to processing system 400.

Storage controller 434 connects one or more storage devices 446, accessed via storage bus 448, to peripheral bus 432. For example, storage controller 434 may be a SCSI controller and storage devices 446 may be SCSI discs. I/O device 436 may be a local area network interface, such as an Ethernet card. Secondary bus bridge 438 may provide an interface between processing system 400 and secondary bus devices 450 via secondary bus 452. For example, secondary bus bridge 438 may be a universal serial port (USB) controller and secondary bus devices 450 may be USB devices. Multimedia processor 440 may be a sound card, a video capture card, or any other type of media interface, and may also be connected to an additional device such as speakers 454. Legacy device interface 442 connects one or more legacy devices 456, such as older style keyboards and mice, to processing system 400.

Processing system 400 in FIG. 9 is only exemplary of processing systems in which the invention can be used. While FIG. 9 illustrates a processing architecture especially suitable for a general purpose computer, such as a personal computer or workstation, well known modifications can be made to configure processing system 400 to be more suitable for use in various specific applications. For example, many electronic devices that require processing may be implemented using a simpler architecture that relies on a CPU 402 connected to memory components 422 and/or memory devices 424. Modifications may include, for example, elimination of unnecessary components, addition of specialized devices or circuits, and/or integration of two or more devices.

Figure 10:
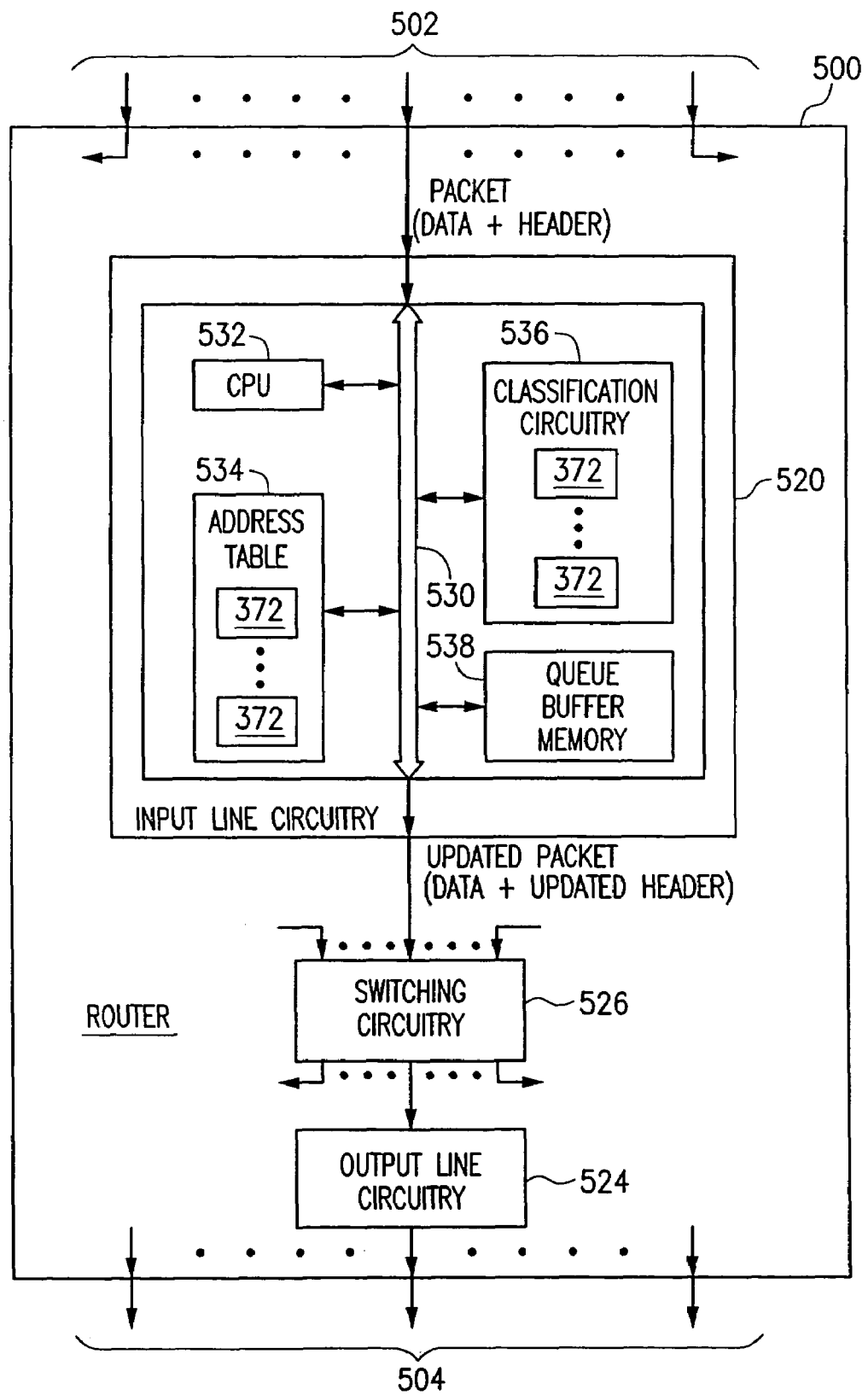
FIG. 10 is a schematic circuit diagram of a router that includes an integrated circuit as in FIG. 8.

A more common application of CAM circuitry is in routers. FIG. 10 shows a simplified block diagram of a router 500 as may be used in a communications network such as the Internet backbone. Router 500 has input lines 502 and output lines 504. In applications where data is transmitted from location to location in packets, router 500 can receive a packet on input lines 502, decode a part of the packet identifying its final destination, provide forwarding instructions for the packet, and transmit the packet on output lines 504.

Router 500 includes circuitry for each input line, as illustrated by input line circuitry 520 for one of input lines 502. Router 500 similarly includes circuitry for each output line, as illustrated by output line circuitry 524 for one of output lines 504. Input line circuitry 520 and output line circuitry 524 can each be implemented as linecards, and a respective linecard can sit on each ingress or egress port. Ingress port linecards can receive input packets from input lines 502, process them, and send the resulting processed packets via switching circuitry 526 to egress port linecards. Egress port linecards can further process the packets before sending them out on output lines 504. Therefore, ingress and egress port linecards can be implemented with similar or identical circuitry, so that the same linecard could be used either as input line circuitry 520 or output line circuitry 524.

Exemplary components of input line circuitry 520 are shown, although circuitry 520 could be implemented in many different ways. Bus circuitry 530 provides communication between CPU 532 and other components, which include address table 534, classification circuitry 536, and queue buffer memory 538. Address table 534 and classification circuitry 536 each illustratively include a set of one or more CAM chips 372, as in FIG. 8. CAM chips 372 can be used to efficiently retrieve information used by CPU 532 in processing and retransmitting packets.

In operation, CPU 532 can provide a packet's internet protocol (IP) address to address table 534, where the IP address can be provided to CAM chips 372 as a search key for retrieval of an IP address for the next hop. Then CPU 532 uses the next hop's IP address to update the packet's header. CPU 532 can also provide all or part of the packet to classification circuitry 536, which can respond with information for services such as prioritization, security, accounting, traffic shaping, and so forth. Classification circuitry 536 can provide parts of the packet to CAM chips 372 as search keys for retrieval of relevant information. Upon updating the packet's header (and possibly also its data) to include the next hop IP address and possibly information from classification circuitry 536, CPU 532 can provide the packet to queue buffer memory 538, where it is stored until it can be retransmitted, such as through switching circuitry 526.

Although the invention has been described with specific reference to obtaining specific search results such as an address code and array match signals for a CAM, the invention has broader applicability and may be used to obtain other CAM search results. Although described in combination with a CAM array with 1024 entries that is searched at widths 80, 160, and 320 bits, the described techniques for obtaining search results are applicable to CAMs of any size searched at any appropriate widths, such as 640 bits or more. The described techniques for combining match signals to obtain a combined match signal involves a specific set of logical combinations, but other logical or equivalent arithmetic combinations could be used. Also, although exemplary circuits and IC layout features have been described and illustrated, such as match combining circuitry and match and FNH bit selecting circuitry, various other circuits and layouts could be employed. Similarly, the methods described above are merely exemplary.

In the above implementation, when a priority signal indicates that a location's match signal is asserted and has priority, and the location's FNH bit is set, the output match bit is turned off, causing other circuitry to disregard the address code. More generally, a location's stored suppress value could indicate other outcomes, such as that the location's match signal should be ignored or suppressed in obtaining combined match signal, priority signals, or selected match signals.

The above description and drawings illustrate exemplary embodiments that achieve the objects, features, and advantages of the invention, but it is not intended that the invention be limited to any illustrated or described embodiment. Any modification that comes within the spirit and scope of the following claims should be considered part of the invention.

What is claimed as new and desired to be protected by Letters Patent of the United States is:

1. A content addressable memory (CAM), comprising:
   a CAM array that stores entries in P memory locations that each have a location width and that stores, for each memory location, a suppress value, the CAM array providing, for each memory location, a match signal indicating whether the location has a stored entry satisfying a match criterion and suppress signals based on locations' suppress values;
   match combining circuitry that responds to the match signals and to a signal indicating a search width that is a multiple of the location width, the match combining circuitry providing P/Q combined match signals, each combined match signal indicating a combination of a group of Q match signals, the combination depending on the indicated search width; and
   search results circuitry that responds to the combined match signals and to the suppress signals, providing an address code of a memory location, the memory location storing at least part of an entry of the indicated search width that satisfies the match criterion.

2. The content addressable memory of claim 1, wherein the search results circuitry includes a priority encoder that prioritizes match signals.

3. The content addressable memory of claim 1, wherein each group of memory locations includes four memory locations, the search width being once, twice, or four times the location width.

4. A content addressable memory (CAM), comprising
   a CAM array that stores entries in P memory locations that each have a location width, the CAM array providing, for each location, a match signal indicating whether the location has a stored entry satisfying a match criterion;
   match combining circuitry that responds to the match signals and to a signal indicating a search width that is a multiple of the location width, the match combining circuitry providing P/Q combined match signals, each combined match signal indicating a combination of a group of Q match signals, the combination depending on the indicated search width;
   priority encoding circuitry that responds to the combined match signals, providing P/Q priority signals, each priority signal indicating, for a respective combined match signal, whether it has priority and is asserted, the priority encoder circuitry also providing a PE match signal indicating whether any of the combined match signals is asserted;
   MSB address encoding circuitry that responds to the priority signals, providing Log2(P/Q) most significant bits (MSBs) of a (log2P)-bit address code for the respective memory locations of a selected group of match signals; and
   LSB circuitry that responds to a selected group of match signals and to the signal indicating the search width, the LSB circuitry providing log2Q least significant bits (LSBs) of the address code, the address code being a memory location of one of the selected group of match signals, the memory location storing at least part of an entry of an indicated search width that satisfies the match criterion.

5. The content addressable memory of claim 4, wherein P is 1024 and Q is 4.

6. The content addressable memory of claim 4, wherein the location width is 80 bits and the search width is one of 80, 106, and 320 bits.

7. A content addressable memory (CAM), comprising
   a CAM array that stores entries in P memory locations that each have a location width and that stores, for each memory location, a suppress value; the CAM array providing, for each memory location, a match signal indicating whether the location has a stored entry satisfying a match criterion and suppress signals based on locations' suppress values;
   priority encoding circuitry that responds to the combined match signals, providing P/Q priority signals, each priority signal indicating, for a respective combined match signal, whether it has priority and is asserted, the priority encoder circuitry also providing a PE match signal indicating whether any of the combined match signals is asserted; and
   search results circuitry that responds to the priority signals and to the suppress signals, providing output search results.

8. The content addressable memory of claim 7, wherein the search results include an address code of a memory location, the memory location storing at least part of an entry of an indicated search width that satisfies the match criterion.

9. The content addressable memory of claim 7, wherein the search results include an array match signal.

10. A content addressable memory (CAM), comprising:
    a CAM array that stores entries in P memory locations that each have a location width and that stores, for each memory location, a suppress value, the CAM array providing, for each memory location, a match signal indicating whether the location has a stored entry satisfying a match criterion and suppress signals based on locations' suppress values;
    match combining circuitry that responds to the match signals and to a signal indicating a search width that is a multiple of the location width, the match combining circuitry providing P/Q combined match signals, each combined match signal indicating a combination of a group of Q match signals, the combination depending on the indicated search width;
    priority encoding circuitry that responds to the combined match signals, providing P/Q priority signals, each priority signal indicating, for a respective combined match signal, whether it has priority and is asserted; the priority encoder circuitry also providing a PE match signal indicating whether any of the combined match signals is asserted;
    match selecting circuitry that responds to the priority signals, selecting the respective group of Q match signals of the combined match signals that has priority and is asserted; and
    suppress selecting circuitry that responds to the priority signals, selecting a group of Q suppress signals for the respective memory locations of the selected group of match signals.

11. The content addressable memory of claim 10, wherein the location width is 80 bits and the search width is one of 80, 106, and 320 bits.

12. The content addressable memory of claim 10, wherein P is 1024 and Q is 4.

13. A router comprising:

input lines that receive data transmissions;

output lines that retransmit data transmissions received on the input lines; and content addressable memory circuitry that provides information used to retransmit data transmissions on the output lines, the CAM circuitry comprising:

a CAM array that stores entries in P memory locations that each have a location width and that stores, for each memory location, a suppress value, the CAM array providing, for each memory location, a match signal indicating whether the location has a stored entry satisfying a match criterion and suppress signals based on locations' suppress values, match combining circuitry that responds to the match signals and to a signal indicating a search width that is a multiple of the location width, the match combining circuitry providing P/Q combined match signals, each combined match signal indicating a combination of a group of Q match signals, the combination depending on the indicated search width, and search results circuitry that responds to the combined match signals and to the suppress signals, providing an address code of a memory location, the memory location storing at least part of an entry of the indicated search width that satisfies the match criterion.

* * * * *